(12) United States Patent
Kato et al.

(10) Patent No.: US 9,699,892 B2
(45) Date of Patent: Jul. 4, 2017

(54) ELECTRIC ELEMENT-EMBEDDED MULTILAYER SUBSTRATE AND METHOD FOR MANUFACTURING THE SAME

(71) Applicant: Murata Manufacturing Co., Ltd., Nagaokakyo-shi, Kyoto-fu (JP)

(72) Inventors: Noboru Kato, Nagaokakyo (JP); Masahiro Ozawa, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 150 days.

(21) Appl. No.: 14/021,103

(22) Filed: Sep. 9, 2013

(65) Prior Publication Data

US 2014/0003011 A1    Jan. 2, 2014

Related U.S. Application Data

(63) Continuation of application No. PCT/JP2012/053949, filed on Feb. 20, 2012.

(30) Foreign Application Priority Data

Mar. 10, 2011    (JP) .................................. 2011-053028

(51) Int. Cl.
*H05K 1/18*    (2006.01)
*H05K 1/02*    (2006.01)
(Continued)

(52) U.S. Cl.
CPC ....... *H05K 1/0271* (2013.01); *H01L 23/5389* (2013.01); *H05K 1/186* (2013.01); *H05K 1/188* (2013.01); *H05K 3/4617* (2013.01); *H05K 3/4644* (2013.01); *H01L 23/49822* (2013.01); *H01L 2224/16225* (2013.01); *H01L 2924/19105* (2013.01); *H05K 1/0206* (2013.01);
(Continued)

(58) Field of Classification Search
CPC .......................... H01L 23/49838; H01L 24/82
USPC ....................... 361/760–766, 792–795, 803; 174/258–264
See application file for complete search history.

(56) References Cited

U.S. PATENT DOCUMENTS 5,569,545 A    10/1996    Yokono et al.
8,629,354 B2 *    1/2014    Cho et al. .................... 174/262
(Continued)

FOREIGN PATENT DOCUMENTS

JP    07-314603 A    12/1995
JP    2006-121005 A    5/2006
(Continued)

OTHER PUBLICATIONS

Official Communication issued in International Patent Application No. PCT/JP2012/053949, mailed on Mar. 13, 2012.
(Continued)

*Primary Examiner* — Tuan T Dinh
(74) *Attorney, Agent, or Firm* — Keating & Bennett, LLP (57) ABSTRACT

An electric element-embedded multilayer substrate, which is a multilayer substrate including an electric element embedded therein and a plurality of base material layers having flexibility, the electric element including a main surface and being embedded in the multilayer substrate to be sandwiched between the base material layers, and a slide member provided between the main surface of the electric element and the base material layer.

18 Claims, 8 Drawing Sheets

(51) Int. Cl.
*H01L 23/538* (2006.01)
*H05K 3/46* (2006.01)
*H01L 23/498* (2006.01)

(52) U.S. Cl.
CPC ......... *H05K 3/4632* (2013.01); *H05K 3/4635* (2013.01); *H05K 2201/0141* (2013.01); *H05K 2201/09781* (2013.01); *H05K 2201/10674* (2013.01); *Y10T 29/4913* (2015.01); *Y10T 29/49139* (2015.01)

(56) References Cited

U.S. PATENT DOCUMENTS

| | | | |
|---|---|---|---|
| 2006/0115931 A1* | 6/2006 | Hsu | 438/121 |
| 2007/0262441 A1* | 11/2007 | Chen | 257/706 |
| 2008/0007927 A1 | 1/2008 | Ito et al. | |
| 2008/0101044 A1* | 5/2008 | Chang | 361/761 |
| 2008/0117608 A1* | 5/2008 | Seo | H01L 24/82 |
| | | | 361/761 |
| 2009/0188703 A1* | 7/2009 | Ito | H01L 23/49838 |
| | | | 174/255 |

FOREIGN PATENT DOCUMENTS

| | | |
|---|---|---|
| JP | 2009-295949 A | 12/2009 |
| WO | 2007/069789 A1 | 6/2007 |

OTHER PUBLICATIONS

Official Communication issued in corresponding Japanese Patent Application No. 2013-503441, mailed on Jul. 29, 2014.

* cited by examiner

ELECTRIC ELEMENT-EMBEDDED MULTILAYER SUBSTRATE AND METHOD FOR MANUFACTURING THE SAME

BACKGROUND OF THE INVENTION

1. Field of the Invention

The present invention relates to an electric element-embedded multilayer substrate, which is a multilayer substrate including an electric element embedded therein, and a method for manufacturing the same.

2. Description of the Related Art

Various types of electronic equipment, such as a mobile phone, tend to be downsized. Accordingly, electric elements such as circuit elements defining electronic equipment also tends to be downsized. Under such a circumstance, an electric element such as a circuit element is mounted on and integrated with a multilayer substrate, and used as an electric element-integrated multilayer substrate.

Figure 13:
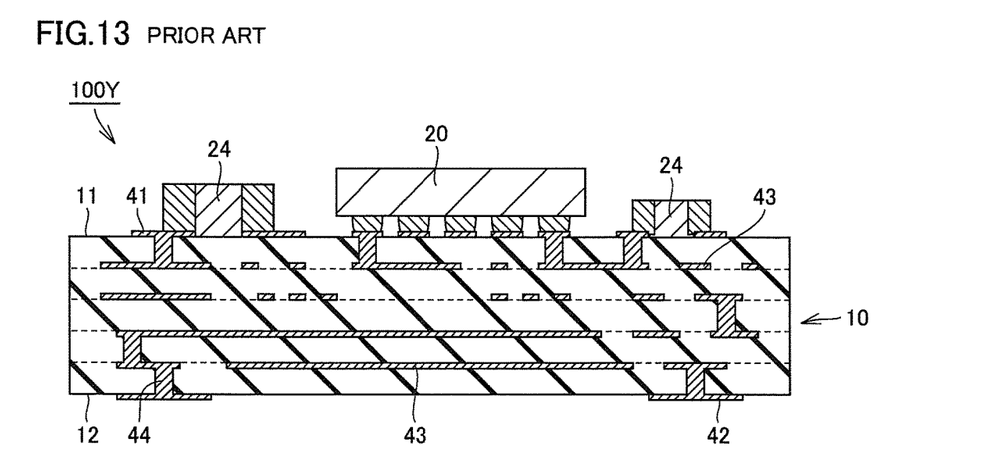
FIG. 13 is a cross sectional view showing a typical electric element-integrated multilayer substrate.

A typical electric element-integrated multilayer substrate 100Y will be described with reference to FIG. 13. Electric element-integrated multilayer substrate 100Y includes a multilayer substrate 10 formed by stacking a plurality of base material layers. In-plane wires 43 and interlayer wires 44 are formed within multilayer substrate 10. A front surface electrode 41 is formed on a front surface 11 of multilayer substrate 10. A back surface electrode 42 is formed on a back surface 12 of multilayer substrate 10.

In electric element-integrated multilayer substrate 100Y, an active element 20 and passive elements 24 are mounted as electric elements on the front surface 11 of multilayer substrate 10. The active element 20 and passive elements 24 are electrically connected to front surface electrode 41. The active element 20 is, for example, a semiconductor integrated circuit chip or the like. Passive element 24 is, for example, a capacitor chip, a resistor chip, or the like.

Figure 14:
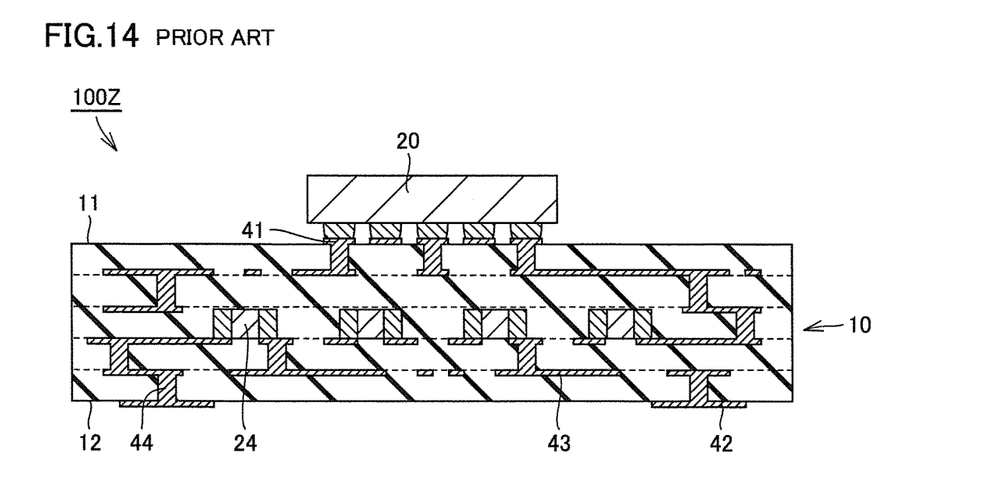
FIG. 14 is a cross sectional view showing a typical electric element-embedded multilayer substrate.

An electric element-embedded multilayer substrate 100Z as another typical electric element-integrated multilayer substrate will be described with reference to FIG. 14. In the electric element-embedded multilayer substrate 100Z, the active element 20 is mounted on a front surface 11 of multilayer substrate 10. Passive elements 24 are mounted within multilayer substrate 10. Passive elements 24 embedded in multilayer substrate 10 are electrically connected to in-plane wire 43.

A configuration having a passive element 24 embedded in multilayer substrate 10 is also disclosed in Japanese Patent Laying-Open No. 2006-121005. In an electric element-embedded multilayer substrate in Japanese Patent Laying-Open No. 2006-121005, a plurality of via hole conductors are arranged on upper and lower surfaces of an electric element. The plurality of via hole conductors are formed by charging a connection material into holes for a plurality of connection via hole conductors.

The plurality of via hole conductors are arranged at positions for regulating inclination of the electric element in a stacking direction, buckling of the via hole conductors having the connection material charged therein, and inclination of a conductor pattern in the stacking direction when a plurality of resin films (base material layers) are heated and pressurized. Japanese Patent Laying-Open No. 2006-121005 describes that, with the electric element-embedded multilayer substrate, reliability of electrical connection between the embedded electric element and the conductor pattern can be improved.

In the electric element-embedded multilayer substrate described in Japanese Patent Laying-Open No. 2006-121005, when the electric element is integrated with the multilayer substrate (base material layers), the electric element and the multilayer substrate (base material layers) are firmly fixed to each other.

When an impact stress is imposed on the electric element-embedded multilayer substrate due to an external cause, such as a dropping of the electric element-embedded multilayer substrate, the stress is also exerted directly on the embedded electric element. In addition, when a stress due to deformation such as warpage or bending, or a stress due to vibration and the like is exerted on the electric element-embedded multilayer substrate, these stresses are also exerted directly on the embedded electric element. By the action of the stress transferred to the electric element, defects such as damage to the electric element itself and disconnection of a wire pattern from the electric element may be caused.

SUMMARY OF THE INVENTION

Preferred embodiments of the present invention provide an electric element-embedded multilayer substrate, which is a multilayer substrate including an electric element embedded therein, that is arranged to significantly reduce or prevent damage to the electric element and prevent disconnection of a wire pattern from the electric element even if a stress, such as an impact or bending, is exerted thereon, and a method for manufacturing the same.

An electric element-embedded multilayer substrate according to a preferred embodiment of the present invention includes a multilayer substrate including a plurality of base material layers having flexibility; an electric element including a main surface and embedded in the multilayer substrate to be sandwiched between the plurality of base material layers; and a slide member provided between the main surface of the electric element and the base material layer.

Preferably, the slide member is a sheet metal member disposed on the base material layer. Preferably, the base material layer is a resin sheet having thermoplasticity, the sheet metal is metal foil including a shiny surface and a matte surface having a surface roughness higher than that of the shiny surface, and the shiny surface defines a contact surface with the main surface of the electric element.

Preferably, the electric element-embedded multilayer substrate further includes an auxiliary member made from the sheet metal disposed on the base material layer, and the auxiliary member is arranged adjacent to the slide member, with the base material layer being sandwiched therebetween, in a direction in which the plurality of base material layers are stacked.

Preferably, the electric element-embedded multilayer substrate further includes an interlayer wire, and the slide member and the auxiliary member are connected by the interlayer wire.

Preferably, the electric element-embedded multilayer substrate further includes an interlayer wire, and the slide member is connected to the interlayer wire extended to a front surface or a back surface of the multilayer substrate.

Preferably, the slide member is provided to include a corner portion of the electric element in planar view in which the slide member is viewed from a stacking direction of the base material layers.

Preferably, a gap portion is provided between the base material layer and a side surface of the electric element. Preferably, the electric element-embedded multilayer substrate further includes an interlayer wire, and a terminal electrode of the electric element is directly connected to the interlayer wire.

A method for manufacturing an electric element-embedded multilayer substrate according to a preferred embodiment of the present invention includes the steps of preparing a plurality of base material layers having flexibility, an electric element including a main surface, and a slide member; sandwiching the electric element between the plurality of base material layers such that the slide member is arranged between the main surface of the electric element and the base material layer; and forming a multilayer substrate including the electric element embedded therein, by stacking the plurality of base material layers.

According to various preferred embodiments of the present invention, an electric element-embedded multilayer substrate, which is a multilayer substrate including an electric element embedded therein, that is capable of significantly reducing or preventing damage to the electric element and preventing disconnection of a wire pattern from the electric element even if a stress such as an impact or bending is exerted thereon, and a method for manufacturing the same can be obtained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments according to the present invention will be described with reference to the drawings. When the number, amount, or the like is referred to in the description of the preferred embodiments, the scope of the present invention is not necessarily limited to such a number, amount, or the like, unless otherwise specified. In the description of the preferred embodiments, identical or corresponding elements will be designated by the same reference numerals, and the same description may not be repeated.

Preferred Embodiment 1

Figure 1:
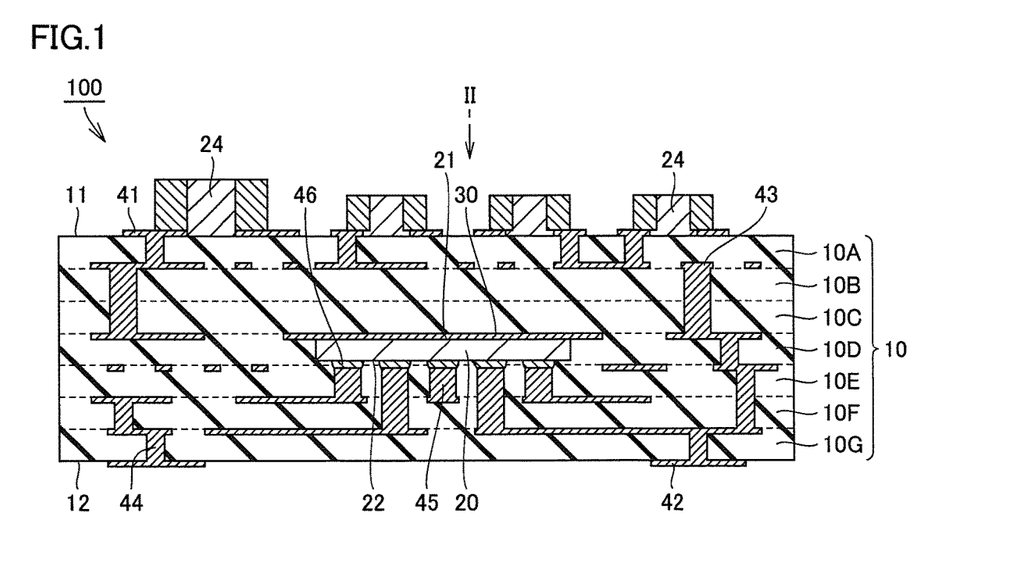
FIG. 1 is a cross sectional view showing an electric element-embedded multilayer substrate in Preferred Embodiment 1 of the present invention.

An electric element-embedded multilayer substrate 100 in accordance with a first preferred embodiment of the present invention (Preferred Embodiment 1) will be described with reference to FIG. 1. FIG. 1 is a cross sectional view showing the electric element-embedded multilayer substrate 100. The electric element-embedded multilayer substrate 100 includes a multilayer substrate 10, an active element 20 (electric element), passive elements 24, and a slide member 30.

The multilayer substrate 10 is preferably defined by stacking a plurality of base material layers 10A to 10G having flexibility. The multilayer substrate 10 itself also has flexibility. Base material layers 10A to 10G are preferably, for example, sheets of thermoplastic resin such as, for example, polyimide or a liquid crystal polymer, as members having a flexibility higher than that of the active element 20 embedded in multilayer substrate 10 (detail will be described later).

A liquid crystal polymer has a low relative dielectric constant and a high Q value. When the electric element-embedded multilayer substrate 100 is used as a high-frequency device, base material layers 10A to 10G are preferably formed of a liquid crystal polymer, for example, because a loss of high frequency signals is reduced.

A front surface electrode 41 is arranged on a front surface 11 of multilayer substrate 10. A back surface electrode 42 is arranged on a back surface 12 of multilayer substrate 10. In-plane wires 43 and interlayer wires 44 are arranged within the multilayer substrate 10. In-plane wires 43 are preferably provided at interfaces between base material layers 10A to 10G. Interlayer wires 44 are preferably arranged to penetrate base material layers 10A to 10G in a stacking direction and to connect front surface electrode 41, in-plane wires 43, and back surface electrode 42 in a predetermined pattern.

A predetermined internal wire pattern is defined by in-plane wires 43 and interlayer wires 44. As the predetermined internal wire pattern, a capacitor or an inductor may be provided in addition to a wire pattern just arranged to provide routing.

Passive elements 24 such as, for example, chip capacitors or chip resistors are preferably mounted on a front surface 11 of multilayer substrate 10. Passive elements 24 are connected to front surface electrode 41 through a conductive junction material such as, for example, solder. A back surface electrode 42 defines a connection terminal. The back surface electrode 42 is used when the electric element-embedded multilayer substrate 100 is mounted on a mother substrate such as a printed wiring board.

The front surface electrode 41, the back surface electrode 42, and the in-plane wires 43 can be formed by, for example, patterning sheet metals disposed on surfaces of base material layers 10A to 10G into predetermined shapes using a thin-film processing technique (such as, for example, a photolithography technique and an etching technique). Interlayer wires 44 can be defined by via hole conductors or the like obtained by charging a conductive paste into micropores opened in base material layers 10A to 10G using laser processing, and performing heat treatment thereon.

The active element 20 is provided in the shape of a rectangular or substantially rectangular parallelepiped, and includes a front surface 21 (main surface) and a back surface 22. The active element 20 is embedded in multilayer substrate 10 to be sandwiched between base material layers 10A to 10G. In the electric element-embedded multilayer substrate 100 in the present preferred embodiment, the active element 20 is preferably located between base material layer 10C and base material layer 10E.

The active element 20 is preferably provided by, for example, a semiconductor bare chip such as a semiconductor integrated circuit chip. The front surface 21 of the active element 20 preferably is a non-functional surface. The back surface 22 of the active element 20 preferably is a functional surface. On the functional surface, various circuit elements such as, for example, a transistor and a terminal electrode 46 used in external connection are provided. Terminal electrode 46 may preferably be made of a ball-shaped or stud-shaped metal material, or may preferably be made of a film-shaped metal material, for example.

When the electric element-embedded multilayer substrate 100 is used, for example, as a multilayer device arranged to control a camera, an IC chip arranged to control a camera is preferably used as the active element 20. When the electric element-embedded multilayer substrate 100 is used, for example, as a multilayer device of an RFIC (Radio-Frequency Integrated Circuit), an RFIC element is preferably used as the active element 20.

Not only the active element 20 but also passive element 24 such as, for example, a chip capacitor, a chip inductor, or a chip resistor, may be embedded in multilayer substrate 10. Further, only passive element 24 may be embedded therein. In this case, passive element 24 preferably defines the electric element. As the electric element embedded in multilayer substrate 10, a functional element such as, for example, a ferrite sintered plate may be used.

Terminal electrode 46 is preferably connected directly to an interlayer wire 45 as a connection electrode defined by the interlayer wire 44. With such a configuration, a smaller and thinner multilayer substrate 10 can preferably be obtained.

A slide member 30 in the shape of a sheet is preferably provided between the front surface 21 of the active element 20 and base material layer 10C. In the present preferred embodiment, the slide member 30 is preferably defined by a sheet metal disposed on a surface of base material layer 10C (or base material layer 10D), as is the in-plane wire 43. The slide member 30 may be prepared as a member separate from the sheet metal defining in-plane wire 43, and thereafter disposed between the front surface 21 of the active element 20 and base material layer 10C.

When the slide member 30 is the sheet metal arranged on the surface of base material layer 10C, a surface of the slide member 30 facing base material layer 10C and base material layer 10C are preferably in a state fixed to each other. On the other hand, a surface of the slide member 30 facing the front surface 21 of the active element 20 and the front surface 21 of the active element 20 are not firmly fixed, and thus they are in a slidable state. Accordingly, the slide member 30 in the present preferred embodiment serves as a member which facilitates a sliding of the active element 20 (in a direction perpendicular or substantially perpendicular to the stacking direction of base material layer 10C), when compared with a multilayer substrate configured such that base material layer 10C and the front surface 21 of the active element 20 are directly in contact with each other. Specifically, in the multilayer substrate configured such that base material layer 10C and the front surface 21 of the active element 20 are directly in contact with each other without providing the slide member 30, base material layer 10C in contact with the front surface 21 of the active element 20 is softened and flows in a pressure-bonding step, and the front surface 21 of the active element 20 and base material layer 10C are fixed (bonded) to each other after base material layers 10A to 10G are fused. Therefore, it becomes difficult for the active element 20 to slide along base material layer 10C. On the other hand, in multilayer substrate 10 in the present preferred embodiment, since the slide member 30 is made of a sheet metal or the like which is unlikely to become fixed (bonded) to the front surface 21 of the active element 20 and is arranged between base material layer 10C and the active element 20, the active element 20 can slide at a contact surface between the slide member 30 and the front surface 21 of the active element 20.

Figure 2:
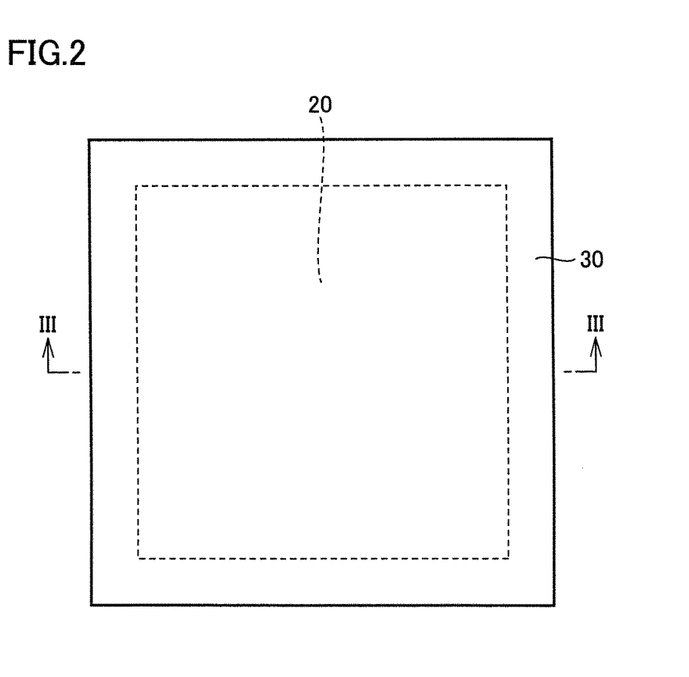
FIG. 2 is a plan view of a slide member used in the electric element-embedded multilayer substrate in Preferred Embodiment 1 of the present invention, as viewed from a stacking direction in the multilayer substrate (a direction indicated by an arrow II in FIG. 1).
Figure 3:
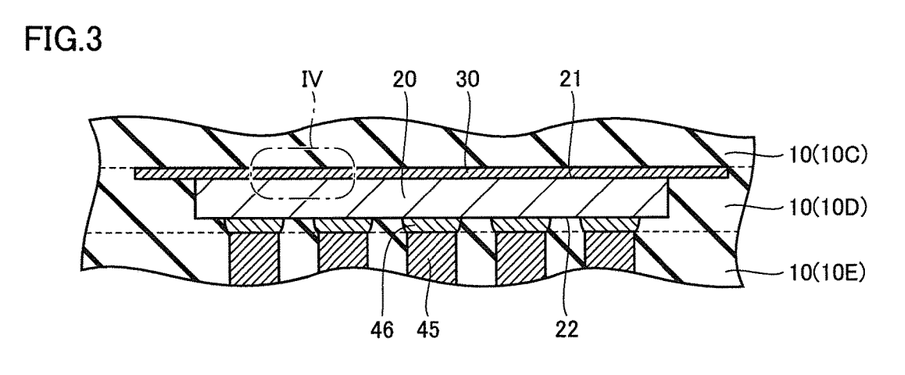
FIG. 3 is a cross sectional view taken along a line III-III in FIG. 2 and viewed in a direction indicated by arrows thereof.

FIG. 2 is a plan view of the slide member 30 as viewed from the stacking direction in multilayer substrate 10 (a direction indicated by an arrow II in FIG. 1). FIG. 3 is a cross sectional view taken along a line III-III in FIG. 2 and viewed in a direction indicated by arrows thereof. In FIG. 2, multilayer substrate 10 is not shown for convenience of illustration and description. Actually, the slide member 30 and the active element 20 are embedded in multilayer substrate 10 as described above (see FIG. 3).

As shown in FIGS. 2 and 3, the slide member 30 in the present preferred embodiment is preferably provided to include (i.e., to cover) the entire front surface 21 of the active element 20 in planar view in which the slide member 30 is viewed from the stacking direction of base material layers 10A to 10G (the direction indicated by arrow II in FIG. 1).

Figure 4:
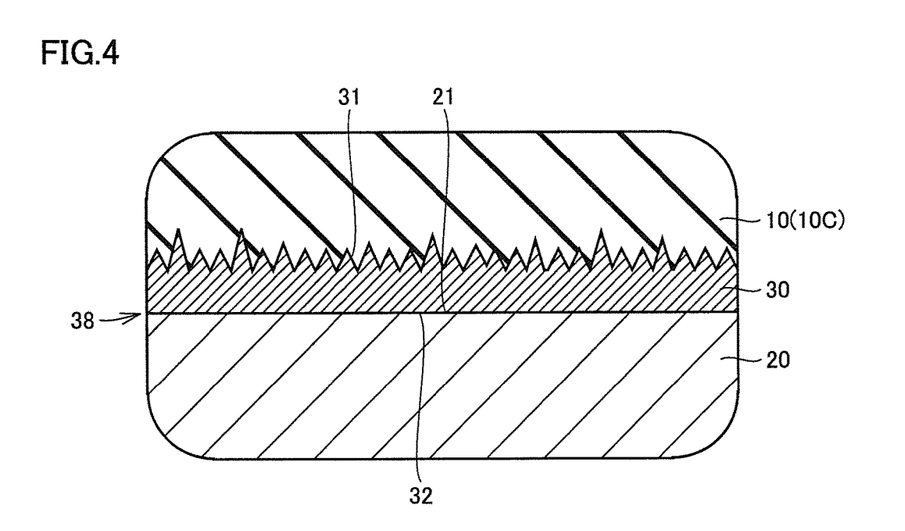
FIG. 4 is a cross sectional view showing a region surrounded by a line IV in FIG. 3 in an enlarged manner.

FIG. 4 is a cross sectional view showing a region surrounded by a dashed line IV in FIG. 3 in an enlarged manner. It is assumed that, as shown in FIG. 4, multilayer substrate 10 (base material layer 10C) is a resin sheet having thermoplasticity, and the sheet metal defining the slide member 30 is preferably a foil of a metal such as, for example, copper or silver. Generally, metal foil is distributed in the market in a state fixed to a back surface of a base material such as a PET (Polyethylene Terephthalate) film. Such metal foil has a matte surface which is a surface in contact with the base material such as a PET film, and a shiny surface which is a surface not in contact with the base material such as a PET film. Since the matte surface is in contact with the base material, such as a PET film having a certain surface roughness, it has a surface roughness higher than that of the shiny surface. In the present preferred embodiment, a contact surface 38 is arranged such that a matte surface 31 of the metal foil (the slide member 30) faces multilayer substrate 10 (base material layer 10C) and a shiny surface 32 of the metal foil (the slide member 30) faces the front surface 21 (main surface) of the active element 20. Since the shiny surface 32 having a surface roughness lower than that of the matte surface 31 is arranged to face the front surface 21 (main surface) of the active element 20, good sliding properties can be exhibited at an interface with the front surface 21 of the active element 20. The electric element-embedded multilayer substrate 100 in the present preferred embodiment is preferably configured as described above.

Figure 5:
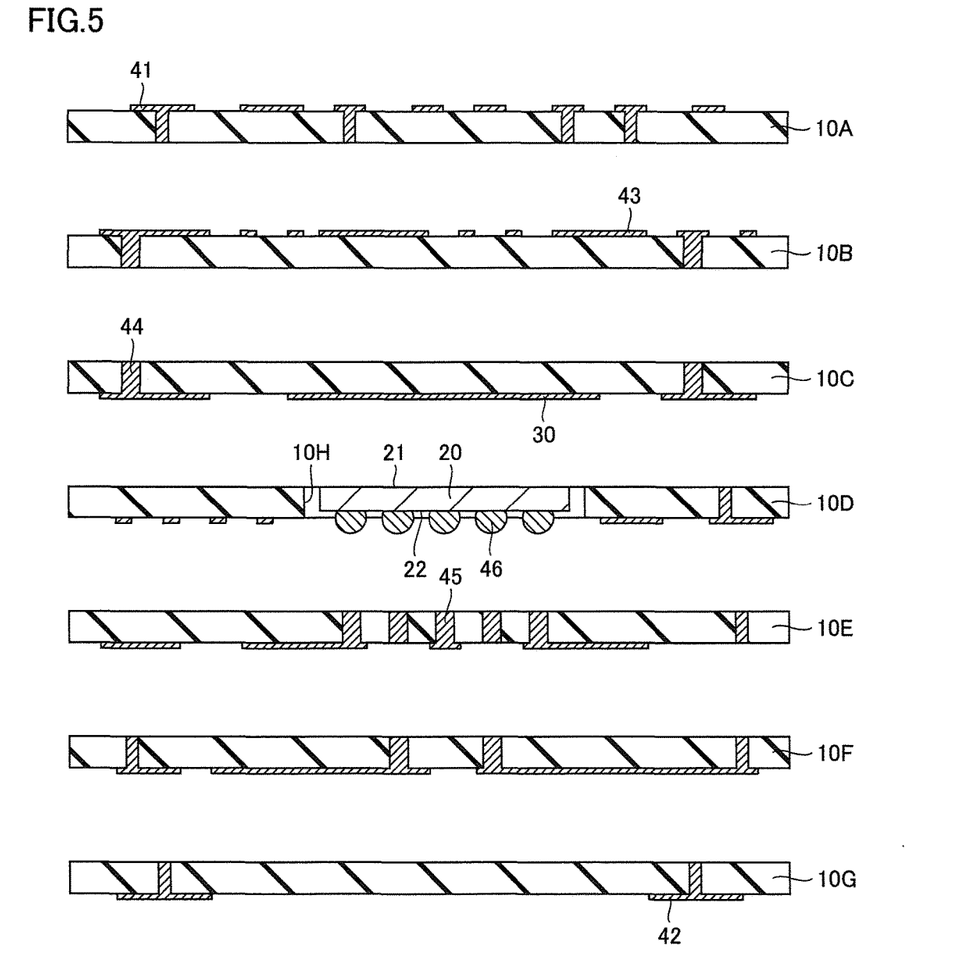
FIG. 5 is a cross sectional view showing a method for manufacturing the electric element-embedded multilayer substrate in Preferred Embodiment 1 of the present invention.

Referring to FIG. 5, in a method for manufacturing the electric element-embedded multilayer substrate 100 (see FIG. 1) according to a preferred embodiment of the present invention, base material layers 10A to 10G, the active element 20 (electric element) having the front surface 21 (main surface), and the slide member 30 are firstly prepared.

On a surface of base material layer 10A, a sheet metal which defines the front surface electrode 41 is preferably patterned in a predetermined shape. On surfaces of base material layers 10B to 10F, sheet metals which define in-plane wires 43 are patterned in predetermined shapes. On a surface of base material layer 10C, a sheet metal which defines the slide member 30 is also patterned in a predetermined shape to include the front surface 21 of the active element 20. The step of patterning the slide member 30 and the step of forming in-plane wire 43 on the surface of base material layer 10C are preferably performed in the same step.

On a surface of base material layer 10G, a sheet metal which defines the back surface electrode 42 is preferably patterned in a predetermined shape. Patterning of the metal foil films can preferably be performed using a thin-film processing technique (such as, for example, a photolithography technique and an etching technique).

In base material layers 10A to 10G, a plurality of interlayer wires 44 are provided to penetrate each of base material layers 10A to 10G in the stacking direction and connect front surface electrode 41, in-plane wires 43, and back surface electrode 42 in a predetermined pattern. To form interlayer wires 44, micropores are preferably opened at predetermined locations in base material layers 10A to 10G by, for example, punching or laser irradiation, and a conductive paste which preferably contains silver or copper and is metalized at a low melting point is charged into the micropores.

The active element 20 is arranged in an opening 10H provided in base material layer 10D. Base material layers 10A to 10G are stacked and pressure-bonded with the active element 20 being arranged in opening 10H.

Specifically, to pressure-bond base material layers 10A to 10G, base material layers 10A to 10G are heated such that at least portions thereof are softened and flow. With portions of the surfaces of base material layers 10A to 10G being softened, base material layers 10A to 10G are fused and integrated.

By heating base material layers 10A to 10G, the conductive paste charged into the micropores is also metalized. The terminal electrode 46 of the active element 20 and the interlayer wire 45 as a connection electrode are also preferably connected to each other by the heating. As in-plane wire 43, a wire whose shape is substantially unchanged by the heating treatment (i.e., a wire which is substantially unmelted) is preferably used.

With the slide member 30 being arranged between the front surface 21 of the active element 20 and the base material layer 10C, the active element 20 is sandwiched between base material layers 10A to 10G (more specifically, between base material layer 10C and base material layer 10E) to form multilayer substrate 10. By forming multilayer substrate 10, the electric element-embedded multilayer substrate 100 having the active element 20 embedded therein is obtained.

In the electric element-embedded multilayer substrate 100, the slide member 30 is preferably provided between the front surface 21 of the active element 20 and the base material layer 10C. Since the contact surface between the front surface 21 of the active element 20 and the slide member 30 is an unbonded surface, sliding between the front surface 21 of the active element 20 and the base material layer 10C is preferably achieved.

Even if the electric element-embedded multilayer substrate 100 is warped, bent, or vibrated, a stress exerted on the active element 20 can be reduced by the action of the sliding. Damage to the active element 20 and disconnection of interlayer wire 45 from the active element 20 (terminal electrode 46) can be effectively reduced or prevented. As a result, the electric element-embedded multilayer substrate 100 having a high strength and excellent reliability can be obtained.

The slide member 30 can be defined by the sheet metal disposed on the surface of base material layer 10C. When the slide member 30 is defined by a sheet metal, the slide member 30 serves as a protective member against the stress exerted on the active element 20. Even if an external stress is exerted on the active element 20 due to a cause such as a dropping impact, the slide member 30 can significantly reduce or prevent the stress exerted on the active element 20. Damage to the active element 20 and disconnection of the interlayer wire 45 from the active element 20 (through, e.g., the terminal electrode 46) can be effectively reduced or prevented.

Further, when the active element 20 is defined by an element having heat dissipation property such as, for example, a power semiconductor, the sheet metal defining the slide member 30 serves as a heat dissipation plate therefor. Thus, heat dissipation properties of the active element 20 can be improved.

When base material layers 10A to 10G are resin sheets having thermoplasticity and the sheet metals formed on the surfaces of base material layers 10A to 10G are metal foils (in other words, when base material layers 10A to 10G are each thermoplastic resin sheet having one surface with metal foil affixed thereon), the shiny surface 32 (see FIG. 4) of the metal foil defines contact surface 38 (see FIG. 4) with the front surface 21 of the active element 20. Since the shiny surface 32 having a surface roughness lower than that of the matte surface 31 is arranged at the contact surface 38 with the front surface 21 of the active element 20, a good sliding property can be exhibited at the interface with the front surface 21 of the active element 20. Further, the property of dissipating heat from the front surface 21 of the active element 20 can also be improved, utilizing the magnitude of the surface roughness of the matte surface 31.

Figure 6:
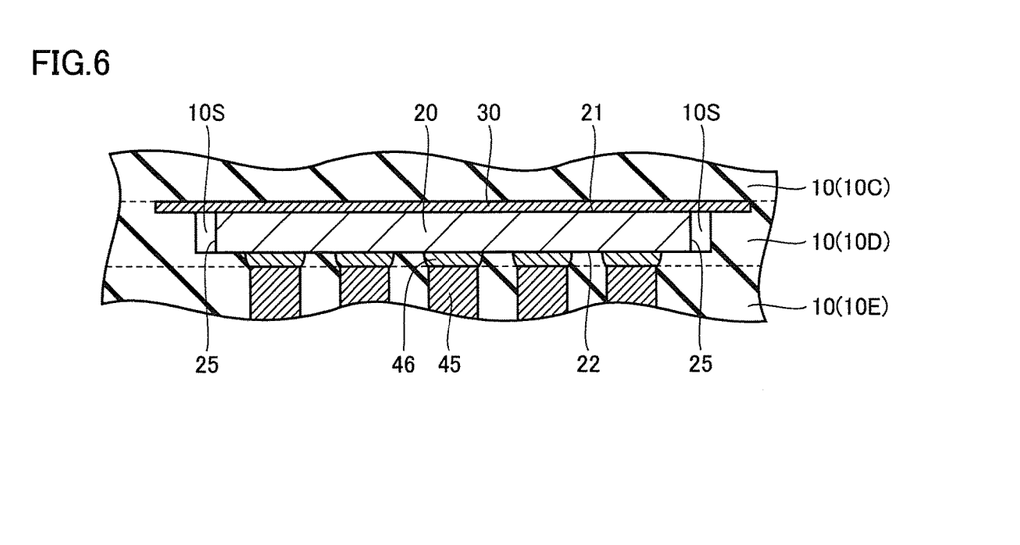
FIG. 6 is a cross sectional view showing a portion of an electric element-embedded multilayer substrate in a first variation of Preferred Embodiment 1 of the present invention in an enlarged manner.

A first variation of Preferred Embodiment 1 will be described with reference to FIG. 6. Gap portions 10S are preferably provided between base material layer 10D and side surfaces 25 of the active element 20. When the metal foil as the slide member 30 is preferably larger than front surface 21 of the active element 20, the shape of the metal foil is substantially unchanged when base material layers 10A to 10G are stacked and pressure-bonded. By the action of the metal foil, the amount of base material layers 10C to 10E which are softened and flow to side surfaces 25 of the active element 20 during heating of base material layers 10A to 10G is reduced, and thus gap portions 10S can be formed.

When the gap portions 10S are provided between base material layer 10D and the side surfaces 25 of the active element 20, even if the electric element-embedded multilayer substrate 100 is bent or warped, a stress imposed on side surfaces 25 of the active element 20 is reduced. Mechanical reliability of the electric element-embedded multilayer substrate 100 can be further improved.

Figure 7:
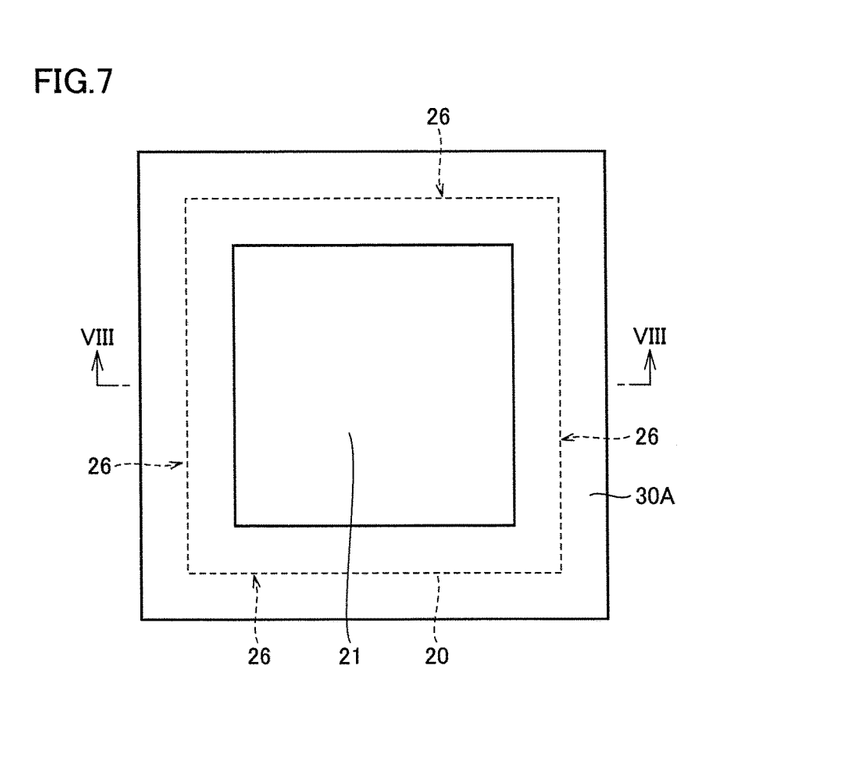
FIG. 7 is a plan view of a slide member used in an electric element-embedded multilayer substrate in a second variation of Preferred Embodiment 1 of the present invention, as viewed from the stacking direction in the multilayer substrate.
Figure 8:
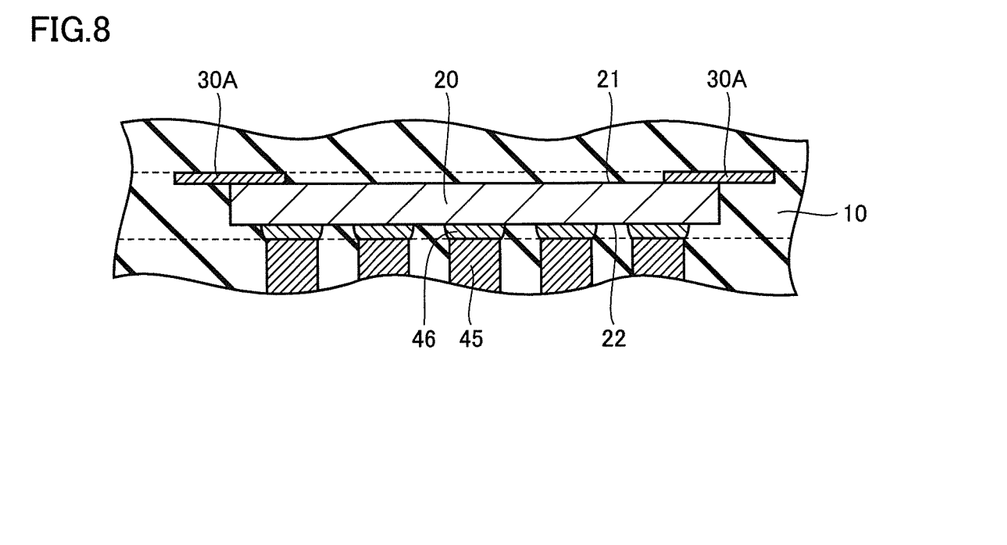
FIG. 8 is a cross sectional view taken along a line VIII-VIII in FIG. 7 and viewed in a direction indicated by arrows thereof.

FIG. 7 is a plan view of a slide member 30A used in an electric element-embedded multilayer substrate in a second variation of Preferred Embodiment 1, as viewed from the stacking direction in the multilayer substrate. FIG. 8 is a cross sectional view taken along a line VIII-VIII in FIG. 7 and viewed in a direction indicated by arrows thereof.

As shown in FIGS. 7 and 8, the slide member 30A in the present variation is preferably provided in the shape of an annular rectangle to cover only a side portion 26 of the active element 20. When a stress is exerted on the electric element-embedded multilayer substrate, a stress greater than that on a central portion of the front surface 21 of the active element 20 is exerted on side portion 26 of the active element 20. Even when the slide member 30A is partially provided to cover only side portion 26 of the active element 20, the slide member 30A can reduced the stress.

Figure 9:
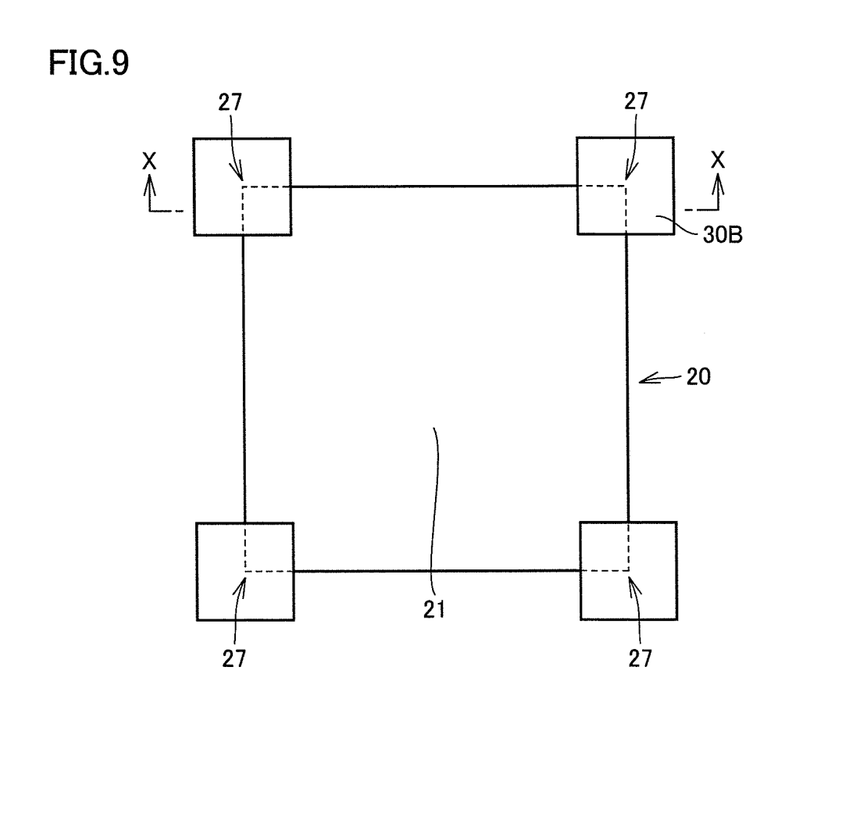
FIG. 9 is a plan view of slide members used in an electric element-embedded multilayer substrate in a third variation of Preferred Embodiment 1 of the present invention, as viewed from the stacking direction in the multilayer substrate.
Figure 10:
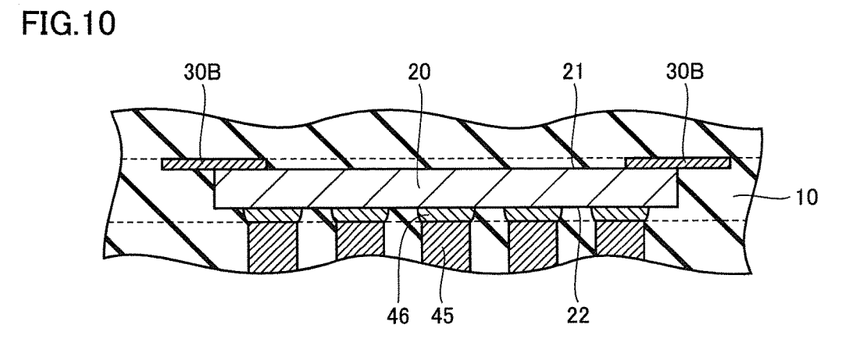
FIG. 10 is a cross sectional view taken along a line X-X in FIG. 9 and viewed in a direction indicated by arrows thereof.

FIG. 9 is a plan view of slide members 30B used in an electric element-embedded multilayer substrate in a third variation of Preferred Embodiment 1, as viewed from the stacking direction in the multilayer substrate. FIG. 10 is a cross sectional view taken along a line X-X in FIG. 9 and viewed in a direction indicated by arrows thereof.

As shown in FIGS. 9 and 10, slide members 30B in the present variation are preferably provided at four locations to cover only corner portions 27 of the active element 20. When a stress is exerted on the electric element-embedded multilayer substrate, a stress greater than that on the central portion of the front surface 21 of the active element 20 is exerted on corner portions 27 of the active element 20. Even when the slide members 30B are partially provided to cover only corner portions 27 of the active element 20, the slide members 30B can reduce the stress.

Preferred Embodiment 2

Figure 11:
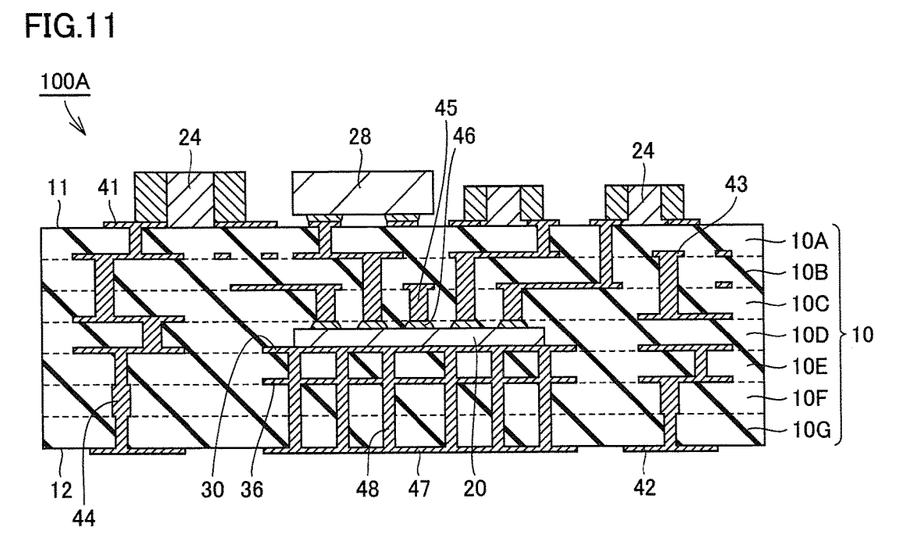
FIG. 11 is a cross sectional view showing an electric element-embedded multilayer substrate in Preferred Embodiment 2 of the present invention.

An electric element-embedded multilayer substrate 100A in a second preferred embodiment of the present invention (Preferred Embodiment 2) will now be described with reference to FIG. 11. FIG. 11 is a cross sectional view showing the electric element-embedded multilayer substrate 100A. The electric element-embedded multilayer substrate 100A preferably includes a multilayer substrate 10, an active element 20, passive elements 24, another active element 28, a slide member 30, and an auxiliary member 36. The other active element 28 is preferably mounted on a front surface 11 of multilayer substrate 10.

The auxiliary member 36 is preferably arranged opposite to the slide member 30 with base material layer 10E being sandwiched therebetween. The auxiliary member 36 is preferably arranged adjacent to the slide member 30 in the direction in which base material layers 10A to 10G are stacked. The auxiliary member 36 can be defined by a sheet metal disposed on a surface of base material layer 10F.

As shown in FIG. 11, the slide member 30 and the auxiliary member 36 are preferably connected by interlayer wires 48. The slide member 30 may be connected to the interlayer wires 48 extended to the back surface 12. The slide member 30 may alternatively be connected to interlayer wires extended to the front surface 11 (this arrangement is not specifically shown).

When the slide member 30 is connected to the interlayer wires 48 extended to the back surface 12 (or the front surface 11), the interlayer wires 48 extended to the back surface 12 (or the front surface 11) are preferably connected to a back surface electrode 47 (or the front surface electrode) formed on the back surface 12 (or the front surface 11). The electric element-embedded multilayer substrate 100A in the present preferred embodiment is configured as described above.

Figure 12:
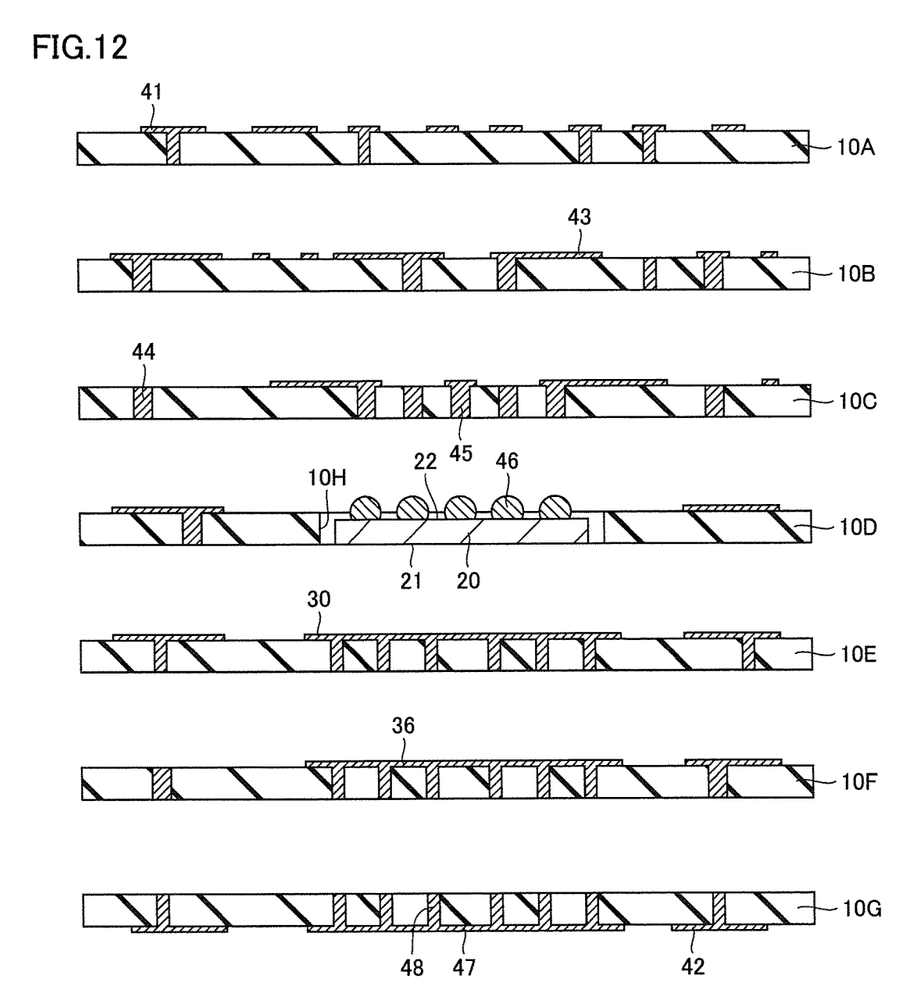
FIG. 12 is a cross sectional view showing a method for manufacturing the electric element-embedded multilayer substrate in Preferred Embodiment 2 of the present invention.

Referring to FIG. 12, in a preferred embodiment of a method for manufacturing the electric element-embedded multilayer substrate 100A (see FIG. 11), base material layers 10A to 10G, the active element 20 (electric element) including the front surface 21 (main surface), the slide member 30, and the auxiliary member 36 are preferably firstly prepared.

The slide member 30 is preferably formed by, for example, patterning a sheet metal disposed on a surface of base material layer 10E in a predetermined shape to include the front surface 21 of the active element 20. The auxiliary member 36 is preferably formed by, for example, patterning the sheet metal disposed on the surface of base material layer 10F in a predetermined shape to have a shape identical or substantially identical to that of the slide member 30 and to be located at a position corresponding to the slide member 30. The step of patterning the auxiliary member 36 and the step of forming in-plane wire 43 on the surface of base material layer 10F are preferably performed in the same step. The auxiliary member 36 may alternatively be prepared as a member separate from a sheet metal defining in-plane wire 43, and thereafter disposed at the position corresponding to the slide member 30.

Base material layers 10A to 10G are stacked and pressure-bonded with the active element 20 being arranged in opening 10H. With the slide member 30 being arranged between the front surface 21 of the active element 20 and base material layer 10E, the active element 20 is sandwiched between base material layers 10A to 10G (more specifically, between base material layer 10C and base material layer 10E) to form multilayer substrate 10. By forming multilayer substrate 10, the electric element-embedded multilayer substrate 100A including the active element 20 embedded therein is obtained.

In the electric element-embedded multilayer substrate 100A, the auxiliary member 36 is arranged adjacent to the slide member 30 in the direction in which base material layers 10A to 10G are stacked. The auxiliary member 36 serves as a protective member against an external stress exerted on the active element 20. Even if the external stress is exerted on the active element 20 due to a cause such as, for example, a dropping impact, the auxiliary member 36 can reduce the stress exerted on the active element 20. Damage to the active element 20 and disconnection of interlayer wire 45 from the active element 20 (terminal electrode 46) can be further effectively reduced or prevented.

Since the slide member 30 and the auxiliary member 36 are connected by the interlayer wires 48, the auxiliary member 36 can preferably further reduce the stress exerted on the active element 20. Further, since the slide member 30 is connected to the interlayer wires 48 extended to the back surface 12 of multilayer substrate 10, the interlayer wires 48 serve as heat dissipation members of the active element 20. In this case, heat dissipation properties in the active element 20 can be further improved. The heat dissipation properties are further improved by connecting the interlayer wires 48 to the back surface electrode 47 (preferably defined by sheet metal) arranged on the back surface 12.

Although the preferred embodiments according to the present invention have been described above, the preferred embodiments disclosed herein are illustrative and non-restrictive in every respect. The technical scope of the present invention is defined by the scope of the claims, and is intended to include any modifications within the scope and meaning equivalent to the scope of the claims. For example, although the slide member 30 in the preferred embodiments described above is defined by a sheet metal such as, for example, a metal foil, the slide member 30 may alternatively be defined by a member other than sheet metal, as long as it has a function of facilitating sliding of the active element 20 on the main surface of the active element 20 when compared with the base material layer. For example, a base material layer in contact with the main surface of the active element 20 which is coated with a silicon-based resin or a fluorine-based resin may be used as the slide member 30.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electric element-embedded multilayer substrate, comprising:
    a multilayer substrate including a plurality of base material layers;
    an electric element including a main surface and embedded in the multilayer substrate so as to be sandwiched between adjacent ones of the plurality of the base material layers; and
    a slide member provided between the main surface of the electric element and one of the base material layers; wherein
    the slide member directly contacts the electric element, and is not adhered or affixed to the electric element; and
    when comparing the slide member and the one of the base material layers, the slide member is more slidable against the electric element than the one of the base material layers;
    wherein the slide member is a sheet metal member disposed on the one of the base material layers;
    wherein the sheet metal member is a metal foil including a shiny surface and a matte surface having a surface roughness higher than a surface roughness of the shiny surface; and the shiny surface defines a contact surface with the main surface of the electric element.

2. The electric element-embedded multilayer substrate according to claim 1, wherein the base material layers are resin sheets including thermoplasticity.

3. The electric element-embedded multilayer substrate according to claim 1, further comprising an auxiliary member defined by the sheet metal member disposed on the one of the base material layers; wherein
    the auxiliary member is arranged adjacent to the slide member, with the one of the base material layers being sandwiched therebetween, in a direction in which the plurality of the base material layers are stacked.

4. The electric element-embedded multilayer substrate according to claim 1, further comprising an interlayer wire, wherein the slide member is connected to the interlayer wire extended to a front surface or a back surface of the multilayer substrate.

5. The electric element-embedded multilayer substrate according to claim 1, wherein the slide member covers a corner portion of the electric element in planar view in which the slide member is viewed from a stacking direction of the base material layers.

6. The electric element-embedded multilayer substrate according to claim 1, wherein a gap portion is provided between the one of the base material layers and a side surface of the electric element.

7. The electric element-embedded multilayer substrate according to claim 1, further comprising an interlayer wire, wherein a terminal electrode of the electric element is directly connected to the interlayer wire.

8. The electric element-embedded multilayer substrate according to claim 1, further comprising a plurality of interlayer wires, wherein the slide member is connected to the plurality of interlayer wires that extends to a front surface or a back surface of the multilayer substrate to contact a surface electrode provided thereon.

9. The electric element-embedded multilayer substrate according to claim 3, further comprising an interlayer wire, wherein the slide member and the auxiliary member are connected by the interlayer wire.

10. A method for manufacturing an electric element-embedded multilayer substrate, the method comprising the steps of:
    preparing a plurality of base material layers, an electric element including a main surface, and a slide member;
    sandwiching the electric element between the plurality of the base material layers such that the slide member is arranged between the main surface of the electric element and the base material layers; and
    forming a multilayer substrate including the electric element embedded therein, by stacking the plurality of the base material layers; wherein
    the slide member directly contacts the electric element, and is not adhered or affixed to the electric element; and
    when comparing the slide member and the one of the base material layers, the slide member is more slidable against the electric element than the one of the base material layers;
    wherein the slide member is a sheet metal member disposed on the one of the base material layers;
    wherein the sheet metal member is a metal foil including a shiny surface and a matte surface having a surface roughness higher than a surface roughness of the shiny surface; and the shiny surface defines a contact surface with the main surface of the electric element.

11. The method for manufacturing an electric element-embedded multilayer substrate according to claim 10, wherein the base material layers are resin sheets including thermoplasticity.

12. The method for manufacturing an electric element-embedded multilayer substrate according to claim 10, further comprising forming an auxiliary member defined by the sheet metal member disposed on the one of the base material layers; wherein
    the auxiliary member is arranged adjacent to the slide member, with the one of the base material layers being sandwiched therebetween, in a direction in which the plurality of the base material layers are stacked.

13. The method for manufacturing an electric element-embedded multilayer substrate according to claim 10, further comprising forming an interlayer wire, wherein the slide member is connected to the interlayer wire extended to a front surface or a back surface of the multilayer substrate.

14. The method for manufacturing an electric element-embedded multilayer substrate according to claim 10, wherein the slide member covers a corner portion of the electric element in planar view in which the slide member is viewed from a stacking direction of the base material layers.

15. The method for manufacturing an electric element-embedded multilayer substrate according to claim 10, wherein a gap portion is provided between the one of the base material layers and a side surface of the electric element.

16. The method for manufacturing an electric element-embedded multilayer substrate according to claim 10, further comprising forming an interlayer wire; wherein
   a terminal electrode of the electric element is directly connected to the interlayer wire.

17. The method for manufacturing an electric element-embedded multilayer substrate according to claim 10, further comprising forming a plurality of interlayer wires, wherein the slide member is connected to the plurality of interlayer wires that extends to a front surface or a back surface of the multilayer substrate to contact a surface electrode provided thereon.

18. The method for manufacturing an electric element-embedded multilayer substrate according to claim 12, further comprising forming an interlayer wire so that the slide member and the auxiliary member are connected by the interlayer wire.

\* \* \* \* \*